United States Patent
D'Evelyn et al.

(10) Patent No.: US 8,216,370 B2
(45) Date of Patent: *Jul. 10, 2012

(54) METHOD FOR REDUCING DEFECT CONCENTRATION IN CRYSTALS

(75) Inventors: Mark Philip D'Evelyn, Niskayuna, NY (US); Thomas Richard Anthony, Schenectady, NY (US); Stephen Daley Arthur, Glenville, NY (US); Lionel Monty Levinson, Niskayuna, NY (US); John William Lucek, Powell, OH (US); Larry Burton Rowland, Scotia, NY (US); Suresh Shankarappa Vagarali, Columbus, OH (US)

(73) Assignee: Momentive Performance Materials Inc., Albany, NY (US)

( * ) Notice: Subject to any disclaimer, the term of this patent is extended or adjusted under 35 U.S.C. 154(b) by 1098 days.

This patent is subject to a terminal disclaimer.

(21) Appl. No.: 11/300,660

(22) Filed: Dec. 12, 2005

(65) Prior Publication Data

US 2006/0096521 A1 May 11, 2006

Related U.S. Application Data

(62) Division of application No. 10/455,007, filed on Jun. 5, 2003, now Pat. No. 7,175,704.

(60) Provisional application No. 60/392,741, filed on Jun. 27, 2002.

(51) Int. Cl.
*C30B 21/04* (2006.01)
(52) U.S. Cl. ......... 117/201; 117/202; 118/716; 118/718
(58) Field of Classification Search .................. 117/201, 117/202; 118/716, 718
See application file for complete search history.

(56) References Cited

U.S. PATENT DOCUMENTS

| 5,679,153 | A | 10/1997 | Dmitrieve et al. | 117/106 |
| 6,214,108 | B1 | 4/2001 | Okamoto et al. | 117/95 |
| 6,217,842 | B1 | 4/2001 | Tanino et al. | 423/345 |
| 6,447,600 | B1 | 9/2002 | Furukawa et al. | 117/2 |
| 7,175,704 | B2 * | 2/2007 | D'Evelyn et al. | 117/2 |
| 2002/0059901 | A1 | 5/2002 | Vodakov et al. | 117/104 |
| 2002/0069818 | A1 | 6/2002 | Naito et al. | 117/109 |

FOREIGN PATENT DOCUMENTS

| JP | 02-124729 | 5/1990 |
| JP | 10-114533 | 6/1998 |
| WO | WO 02/013958 A3 | 2/2002 |

OTHER PUBLICATIONS

Anthony, Diamond & Related Materials, 78-88 (1999), Inclusions in diamonds with solubility changes and phase transformation.
Webb, et al. in J. Mater. Res. vol. 10, No. 7, p. 1700 (1995) Synthetic Diamond Crystal Strength Enhancement through annealing a t 50 Kbar and 1500C.
Dwilinski R et al, "On GaN crystallization by ammonothermal method" Acta Physica Polonica: Series A, Krakow, PL, vol. 90, No. 4, 1996, pp. 763-766, XP002963489.

* cited by examiner

*Primary Examiner* — Bob M Kunemund
(74) *Attorney, Agent, or Firm* — Joseph E. Waters

(57) ABSTRACT

A method for removing defects at high pressure and high temperature (HP/HT) or for relieving strain in a non-diamond crystal commences by providing a crystal, which contains defects, and a pressure medium. The crystal and the pressure medium are disposed in a high pressure cell and placed in a high pressure apparatus, for processing under reaction conditions of sufficiently high pressure and high temperature for a time adequate for one or more of removing defects or relieving strain in the single crystal.

17 Claims, 1 Drawing Sheet

METHOD FOR REDUCING DEFECT CONCENTRATION IN CRYSTALS

CROSS REFERENCE TO RELATED APPLICATIONS

This patent application claims priority date of U.S. Provisional Patent Application No. 60/392,741 filed Jun. 27, 2002, and which is a divisional of non-provisional patent application Ser. No. 10/455,007, filed Jun. 5, 2003 now U.S. Pat. No. 7,175,704.

FIELD OF THE INVENTION

The present invention generally relates to crystals and more particularly to healing voids, micro-pipes, nano-pipes, dislocations, interstitials, vacancies, and strain defects therein, by a high pressure/high temperature (HP/HT) annealing process.

BACKGROUND OF THE INVENTION

Single crystals are useful in a wide variety of applications, including, for example, electronic and optoelectronic devices, lasers, and optics. Crystal performance in these applications often is limited by the material quality of the crystals, in particular, the concentration of defects. Important classes of defects include voids, micro-pipes, nano-pipes, dislocations, interstitials, and vacancies. Defects also introduce strain into crystals, which tends to degrade the quality, performance, and lifetime of epitaxial layers and electronic devices grown on wafers sliced from these crystals Reduction or elimination of these defects during crystal growth can be very difficult, so alternate means would be useful. Defects can also exist in amorphous materials, such as glasses, plastics, and metals, which may detract from their optical, mechanical, electrical, or visual properties.

In the case of silicon carbide (SiC), large area single crystal wafers for electronic device applications are available commercially in several polytypes (6H, 4H, 15R). However, these wafers typically contain dislocations at a concentration of $10^4$-$10^6$ cm$^{-2}$ and micro-pipes at a density of 10-100 cm$^{-2}$. Defect concentrations tend to be higher in semi-insulating SiC, suitable for high-frequency device applications, than in n-type SiC. Both micro-pipes and dislocations have been strongly linked with device failure and degradation phenomena. One reason why silicon carbide based devices have not emerged from small niche markets into large scale, high-power applications is the unreliability of devices resulting from substrate defects. Other than US Patent Publication No. 2002 0059901A1 which discloses a method for growing SiC crystals with a micropipe density below 10 cm$^{-2}$, Applicants are not aware of any currently available method to grow SiC crystals with a micropipe density below 1 cm$^{-2}$, or SiC crystals of at least 25 mm, at least 50 mm, at least 75 mm, or even at least 100 mm diameter that are entirely free of micropipes.

There are several references in the prior art disclosing methods for covering over micropipes in SiC or filling micropipes near the surface. For example, U.S. Pat. No. 5,679,153 discloses a liquid phase epitaxy method to cover up existing micropipes in a wafer. U.S. Pat. Nos. 6,214,108 and 6,217,842; and US Patent Publication No. 2002 0069818A1 disclose methods to provide a coating on a micropipe-containing SiC wafer and perform a heat treatment, causing up to 75 μm or more of the micropipe to be closed. However, these methods require expensive procedures to be applied one-at-a-time to individual SiC wafers. Additionally, they do not provide SiC crystals of at least 25 mm, at least 50 mm, at least 75 mm, or at least 100 mm in diameter that are free of micropipes and microvoids through their entire volume.

In the case of gallium nitride, the quality of substrates currently is low, as they are typically prepared by heteroepitaxy on non-GaN substrates, such as, for example, sapphire or silicon carbide. Due to lattice- and thermal-expansion mismatch, the GaN so formed suffers from threading dislocations at concentrations between about $5 \times 10^5$ and $10^8$ cm$^{-2}$. GaN also tends to grow with substantial concentrations of native defects, such as vacancies, both on Ga and N sites. Simple high-temperature annealing of GaN is precluded by decomposition to Ga+—N$_2$ at temperatures above about 750° C.

The quality of gallium arsenide and indium phosphide wafer substrates is considerably higher than that of SiC or GaN, but the concentration of defects (dislocations, vacancies) is nonetheless sufficiently high to have a deleterious effect on the performance of electronic devices fabricated thereon. The growth technology is sufficiently mature that significant incremental improvements are unlikely. Simple high-temperature annealing is precluded by volatilization of arsenic or phosphorus, which would form vacancies and even droplets of Ga or In.

Banholzer, et al. in Published Patent Application No. WO0213958 disclosed a method to increase the toughness of synthetic diamond by annealing at high pressure and high temperature. There was no specific teaching about reduction in the concentration of voids, micro- or nanopipes, dislocations, or vacancies. Anthony, et al. in Published Patent App. No. WO0213958 and Vagarali, et al. in US Patent Application No. 20010031237A1 disclose modification of the color of natural diamonds by annealing at high pressure and high temperature. These treatments modify the nature, concentration, and distribution of point defects (vacancies, interstitials, substitutional impurities), but these authors provide no teaching about reduction in the concentration of voids, micro- or nanopipes, or dislocations. Webb, et al. in *J. Mater. Res.*, Vol 10, No. 7, p. 1700 (1996), proposed annealing of synthetic type I diamond crystals at 1200°-1700° C. and 50-60 kbars to induce aggregate-nitrogen disassociation and metal coalescence, as well as heal diamond lattice dislocations.

There are several references disclosing annealing crystals in a gas pressure apparatus. U.S. Pat. No. 6,329,215 describes annealing GaN, AlN, and InN under a high nitrogen pressure between 0.1 and 2 GPa as the pressure medium, requiring the use of a very specialized and hazardous gas pressure apparatus. The use of high nitrogen pressure herein is to inhibit decomposition at high temperature, and not to cause defect removal. The annealing conditions taught by Porowski, et al. have been sufficient to anneal point defects and cause atomic diffusion, but no reduction of threading dislocations, micro- or nano-pipes or voids was demonstrated. U.S. Pat. No. 6,447,600 discloses a method for annealing of Si, GaAs, InP, ZnS, and ZnSe in an inert gas at pressures up to 0.3 GPa. However, no reduction of threading dislocations, micro- or nano-pipes or voids is demonstrated and that vacancies in Si could be aggregated into voids. Japanese Patent Publication Nos. JP 10114533A2 and JP 02124729A2 disclose annealing glasses in a gas pressure apparatus at a maximum pressure of 0.2 Gpa.

Thus, there exists a need in the art to heal defects in SiC, GaN, and similar crystals to improve performance of electronic and optoelectronic devices fabricated thereon. In the case of crystals for non-linear optical applications, undesired light scattering will be reduced and laser damage thresholds will be increased. In the case of piezoelectric and relaxor ferroelectric crystals, annealing will increase breakdown fields, efficiency, and lifetime. There similarly exists a need in the art to heal defects in amorphous glasses, plastics, and metals.

BRIEF SUMMARY OF THE INVENTION

The invention relates to a method to reduce defect concentrations in crystals, comprising the steps of (i) providing at least one crystal containing defects; (ii) providing a suitable pressure medium; (iii) disposing the at least one crystal and the pressure medium in a high pressure cell; (iv) disposing the cell in a high pressure apparatus; (v) processing the cell at high pressure and high temperature; and (vi) removing the at least one crystal from the cell. Defects are collapsed and/or anneal out at high pressure and high temperature, and strain is relieved. In one embodiment of the invention, The invention further relates to electronic devices formed on the improved crystals, for example, by deposition of epitaxial semiconductor layers, patterning, and metallization.

DETAILED DESCRIPTION OF THE INVENTION

Figure 1:
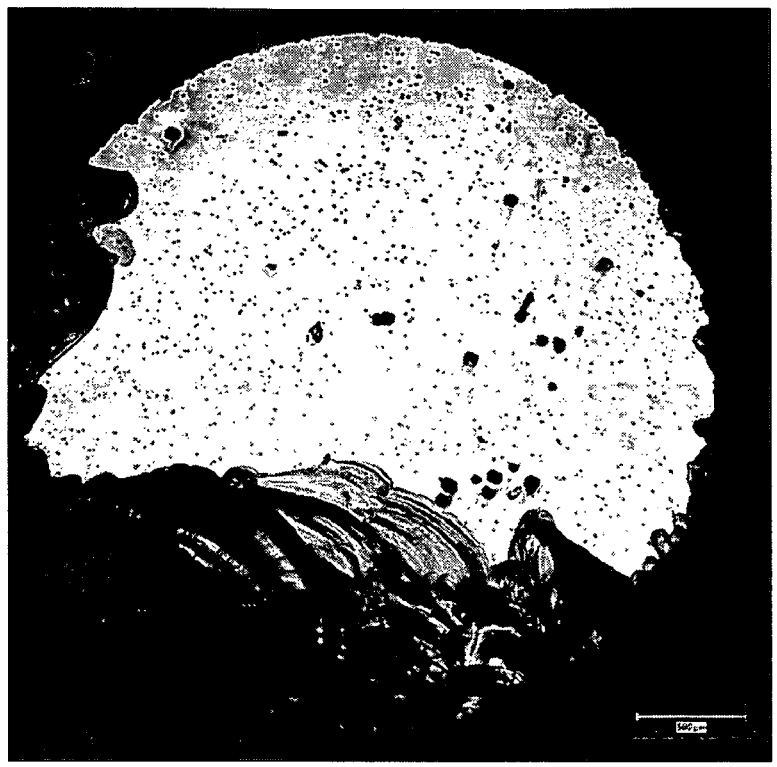
FIG. 1 is an optical micrograph of a highly polished surface of 6H—SiC disk prior to annealing in accordance with the present invention.

In the present invention, defects in crystals are collapsed and/or anneal out at high pressure and high temperature, and strain is relieved. Suitable crystals for treating in accordance with the present invention include, for example, single crystals and assemblages (aggregates) of single crystals, boule crystals, electronic wafers, windows, laser rods, sensors, and the like.

The followings are elements/variables in the process of the present invention: the crystal, the pressure medium, a high-pressure apparatus, annealing process variables including pressure, temperature, and time. In one embodiment of the process of the invention, it may be desirable to control the conditions for cool down and pressure release so as to minimize formation of new defects.

In one embodiment of the invention, the non-diamond crystal is one or more of: a) a direct bandgap semiconductor material; b) a wide bandgap semiconductor material; c) a scintillator material; d) a nonlinear optical material; e) a laser material, f) a relaxor ferroelectric material; g) a piezoelectric material; and h) an indirect bandgap semiconductor material. Examples of the non-diamond crystals of the invention include 6H—SiC, 4H—SiC, 15R—SiC, 3C—SiC, 8H—SiC, 2H—SiC, silicon (Si), germanium (Ge), cubic boron nitride (cBN), gallium nitride (GaN), gallium antimonide (GaSb), aluminum nitride (AlN), aluminum gallium indium nitride (AlInGaN), bismuth antimonide ($Bi_xSb_{1-x}$), indium nitride (InN), gallium arsenide (GaAs), gallium phosphide (GaP), gallium indium phosphide (GaInP), aluminum indium phosphide (AlInP), indium aluminum arsenide (InAlAs), aluminum gallium antinomide (AlGaSb), indium aluminum gallium arsenide (InAlGaAs), aluminum indium gallium phosphide (AlInGaP), aluminum gallium arsenide (AlGaAs), indium gallium arsenide phosphide (InGaAsP), gallium selenide (GaSe), indium phosphide (InP), indium selenide (InSe and $InSe_2$), indium antimonide (InSb), cadmium phosphide ($Cd_3P_2$), cadmium indium sulphide ($CdIn_2S_4$), cadmium silicon arsenide ($CdSiAs_2$), cadmium tin phosphide ($CdSnP_2$), zinc oxide (ZnO), zinc selenide (ZnSe), zinc telluride (ZnTe), cadmium sulphide (CdS), cadmium zinc selenide (CdZnSe), beryllium zinc cadmium selenide (BeZnCdSe), zinc cadmium magnesium selenide (ZnCdMgSe), zinc sulphur selenide (ZnSSe), beryllium zinc selenide (BeZnSe), beryllium magnesium zinc selenide (BeMgZnSe), cadmium telluride (CdTe), cadmium zinc telluride ($Cd_xZn_{1-x}Te$), mercury cadmium telluride (HgCdTe), lead sulphide (PbS), lead telluride (PbTe), lead selenide (PbSe), lead tin telluride (PbSnTe), lead germanium telluride (PbGeTe), lead europium telluride (PbEuTe), lead europium selenide (PbEuSe), lead cadmium sulphide (PbCdS), lead europium selenium telluride (PbEuSeTe), lead sulphur selenide (PbSSe), lithium triborate ($LiB_3O_5$ or LBO), yttrium orthovandate ($YVO_4$), potassium titanyl phosphate ($KTiOPO_4$ or KTP), potassium niobate ($KnbO_3$ or KN), cesium lithium borate ($CsLiB_6O_{10}$ or CLBO), $LiCaAlF_6$ (LiCAF), $LiSrAlF_6$ (LiSAF), lead zirconate titanate ($Pb(Zr_xTi_{1-x})O_3$ or PZT), lead magnesium niobate ($Pb(Mg_{1/3}Nb_{2/3})O_3$ or PMN), lead zirconate niobate ($Pb(Zr_{1/3}Nb_{2/3})O_3$ or PZN), bismuth silicon oxide (BSO), barium titanate (BTO), lead magnesium niobate titanate ($Pb(Mg_{x/3}Nb_{2x/3}Ti_{1-x})O_3$ or PMNT), lead zirconate niobate titanate ($Pb(Zr_{x/3}Nb_{2x/3}Ti_{1-x})O_3$ or PZNT), strontium hafnate ($SrHfO_3$) and barium hafnate ($BaHfO_3$), rare earth lanthanide-ion laser crystals with matrices of silica, silicates and fluorozirconates, lasers crystals based on matrices of KCl, RbCl, NaCl, CuCl, CsI, $CaF_2$, $ZnF_2$, $MgF_2$, $SrF_2$, $MnF_2$, ZnS, ZnSe, $CaF_2$—$ErF_3$, KI, $RbCaF_3$, $LiNbO_3$, $KmgF_3$, $Ca_2PO_4Cl$, $CaGd_2(SiO_4)_3O$, $LaCl_3$, $LiYF_4$, $LaF_3$, $Y_3Al_5O_{12}$, $LiYF_4$, $LuAlO_3$, $YalO_3$, $Gd_3Ga_5O_{12}$, $CaF_2$—$ErF_3$, $Er_3Al_5O_{12}$, $Lu_3Al_5O_{12}$, $BaYb_2F_8$, NaF, LiF, sapphire, alexandrite, forsterite, $LiYF_4$, $BaF_2$, $BaY_2F_8$, $BaEr_2F_8$, RbBr, $Li_2GeO_3$, $Y_2O_3$, $Er_2O_3$, $YVO_4$, $GdAlO_3$, $Y_3Sc_2Ga_3O_{12}$, $NaCaErF_6$, $CaWO_4$, or $CaMoO_4$, and similar analogous compounds.

In one embodiment of the invention, the crystal comprises a boule, having a dimension of between about 0.1 mm and 500 mm. In a third embodiment, the crystal in the form of a boule has a ratio between the maximum and minimum dimension is below about 10, so that the crystal is not overly susceptible to breakage.

In one embodiment of the method to remove defects in the non-diamond crystal of the invention, the pressure medium is such that it is capable of distributing pressure approximately uniformly over the crystal so that non-hydrostatic stresses are minimized. In one embodiment of the invention, the pressure medium may be a liquid under processing conditions, a supercritical fluid, or a low-shear-strength solid, with an internal friction below 0.2. In another embodiment of the invention, the pressure medium is a liquid or a solid at room temperature or at dry ice temperature (−77° C.), as this enables convenient and safe filling and handling of the cell and avoids the necessity for a specialized gas pressure apparatus. If the pressure transmission medium is a solid, it is desirable that the material be compacted to greater than about 85% of its theoretical density prior to disposition in the cell in order to avoid introducing excess porosity into the cell.

The pressure medium should be stable at the processing temperature and pressure, that is, it preferably does not decompose or react with the crystal or the other components of the cell. Examples of pressure medium include metal halides, such as NaCl, NaBr, AgCl, AgBr, $CaF_2$, or $SrF_2$. Sodium chloride performs particularly well at temperatures approaching its melting point, which, at pressures of about 1 to about 2 GPa, is between about 1000° C. and about 1150° C. In another embodiment, the pressure medium is graphite or hexagonal boron nitride. In yet another embodiment, the pressure medium is a nitrogen-containing fluid, such as ammonia, hydrazine, methylamine, or melamine. Alternatively, the pressure transmission medium may comprise at least one of talc, pyrophyllite, molybdenum disulfide, calcium carbonate, magnesium oxide, zirconium oxide, merylinite clay, bentonite clays, or sodium silicate. In another embodiment the pressure medium is a molten glass under processing conditions. In one embodiment, the glass comprises at least one of $Li_2O$, $Na_2O$, $K_2O$, MgO, CaO, SrO, BaO, $B_2O_3$, $Al_2O_3$, $Ga_2O_3$, $In_2O_3$, $SiO_2$, $GeO_2$, SnO, PbO, a phosphate glass, a fluoride glass, a nitride glass, and compounds or mixtures thereof.

In one embodiment of the invention, the pressure medium comprises at least one of an inert gas such as argon, helium, xenon, or nitrogen, for use in conjunction with processing pressure conditions of below 1 Gpa, such that commercially available autoclaves or internally heated pressure vessels may be employed.

In another embodiment, the inert-gas pressure medium is used in conjunction with second, molten pressure medium immediately surrounding the crystal in order to prevent direct contact between the gas and the crystal. For example, it may be desirable that micropipes in the crystal not be allowed to fill with gas during the annealing treatment. The second pressure medium may be provided as a glass in solid or powder form and melted prior to application of pressure during processing. In one embodiment, the glass comprises at least one of $B_2O_3$, $SiO_2$, $Na_2O$, CaO, MgO, $Al_2O_3$, or mixtures and compounds thereof.

In some embodiments, the crystal to be annealed has a tendency to decompose at temperatures high enough for proper annealing to take place. For example, GaN begins to decompose to Ga+$N_2$ at temperatures above about 750° C., and the vapor pressure of arsenic above GaAs is a few atmospheres at the melting point. In this case, the pressure medium should comprise components to suppress the decomposition. For example, decomposition of GaN can be prevented by annealing in $N_2$, ammonia, or a nitrogen-containing fluid whose nitrogen activity is higher than the value at equilibrium. Decomposition of GaAs can be prevented by using pure arsenic as the pressure medium or by mixing arsenic with another pressure medium material, as listed above.

The crystal and pressure medium are disposed in a suitable high pressure apparatus with internal heating capability. In one embodiment wherein at least one component of the pressure medium is a gas and the processing pressure is below about 1 GPa, a hot isostatic press (HIP) or internally-heated pressure vessel is used. At higher pressures, a piston cylinder press, a belt press, a multi-anvil press, or a toroidal press may be employed, as such presses are well known in the art. In yet another embodiment, a zero-stroke apparatus, as described in U.S. patent application Ser. No. 09/683,658, by M. P. D'Evelyn et al., filed on Jan. 31, 2002, entitled "Improved Pressure Vessel," may be employed.

In one embodiment, the crystal and pressure medium are placed in a sealable deformable capsule, as described in U.S. patent application Ser. No. 09/683,659, by M. P. D'Evelyn et al., with a filing date of Jan. 31, 2002. This embodiment is particularly useful when the process pressure is above about 0.2-0.5 GPa and the pressure medium is a gas or liquid at room temperature or a gas or supercritical fluid under processing conditions.

In one embodiment and following disposition in the pressure vessel, the pressure and temperature are raised to the desired values, and held for a sufficient length of time, then the temperature and pressure are reduced at a controlled rate, the cell is removed from the high pressure apparatus, and the annealed crystal is recovered from the cell.

An epitaxial structure may be formed on the improved crystal. A semiconductor device may also be formed on the improved crystal, for example, by means of deposition of an epitaxial semiconductor layer, patterning, and metallization. The semiconductor device may comprise a light emitting diode (LED), a laser diode, a photodetector, a filter, a transistor, a rectifier, a thyristor, a light amplifier, an emitter, a detector, a diode, a switch, a solar cell, or an optically bistable device In another embodiment, the material to be annealed at high pressure and high temperature is amorphous rather than crystalline. Methods analogous to those described above for crystals may be employed, with the added feature that annealing may be performed either above or below the glass transition temperature. Cooling of the cell after the annealing treatment should be done carefully so as to avoid introduction of new defects into the material.

Pressure Required to Collapse Micro Voids and Nanopipes. In one embodiment wherein the crystal is silicon carbide, creep along basal planes becomes significant at temperatures above 800° C., and creep parallel to the c-axis becomes observable above 1600° C., with activation energies of 2.7 eV and 1.9 eV, respectively. The stress exponents are 3.3 and 4.9 for creep perpendicular or parallel to (0001), respectively, indicating that creep is faster by a factor of $3\times10^{15}$-$10^{23}$ at 5 GPa than at 100 kPa (~ambient conditions). Micro- and nanopipes, therefore, may be eliminated by annealing under a high hydrostatic pressure at temperatures between 1000° and 2000° C.

Although not to be bound by theory, it is believed that the simplest mechanism for collapse of a micro void or nanopipe is plastic yield of material around the defect. The stress $\sigma_v(R)$ around a microvoid with a radius A, an internal pressure $P_i$ in the presence of an external pressure $P_{ext}$ is equal to [T. R. Anthony, *Diamond & Related Materials,* 8, 78-88 (1999)]:

$$\sigma_v(R) \approx (P_{ext} - P_i)(A/R)^3 \quad (1)$$

where R is the radial distance from the center of the microvoid.

Similarly, for the 2-D case of the micropipe, the stress $\sigma_p(R)$ is given by:

$$\sigma_p(R) \approx (P_{ext} - P_i)(A/R)^2 \quad (2)$$

where R is the radial distance from the center of the pipe.

To collapse such defects, plastic yield should occur roughly out to distance R=5 Å from the defect. If the yield strength of the material is given by Y (either for plastic flow or creep), then the external pressure $P_{ext}$ required to collapse a microvoid is:

$$P_{ext} = P_i + 125Y \quad \text{Micro Void} \quad (3)$$

Similarly for a micropipe, the pressure required to collapse the pipe is given by:

$$P_{ext} = P_i + 25Y \quad \text{Micro Pipe} \quad (4)$$

Micro pipes will collapse before micro voids and both defects require pressures higher than the yield strength of the material to collapse. HP/HT conditions are favorable for collapsing these defects because HP implies a large $P_{ext}$ and HT implies a low yield stress Y.

If there is any internal pressure inside of the defect, this internal pressure will increase to keep $P_i A^2$ (pipe) or $P_i A^3$ (void) constant as the defect collapses until the internal pressure resists further collapse. Consequently, unless the internal pressure $P_i$ is zero or the gas in the defect is soluble in the matrix, complete collapse of the defect is impossible. Also, when the external pressure is relieved when the sample is depressurized, there may be an expansion of a defect containing high pressure gas if the stress around the defect generated by this internal pressure is high enough to cause plastic yield of the surrounding matrix. Consequently, it is preferable that the original crystals containing the defects be grown in a vacuum for purposes of this invention, unless such defects are connected to the surface. In the example given for SiC, the micropipes are connected to the surface so that the internal pressure in the micro pipes cannot build up as they collapse.

The crystals processed according to the present invention may be used in the growth of epitaxial structures for use in semi-conductor devices. Illustrative devices and/or wafers sliced and polished from such crystals are illustrated below, for devices with superior properties due to the reduction in defect concentrations and relaxation of strain. In the case of electronic materials such as, for example, SiC, GaN, GaAs, InP, and ZnO, electronic devices fabricated on wafers cut from boules processed according to the inventive method have increased breakdown fields, reduced leakage current, increased thermal conductivity, higher light emission efficiency, and higher reliability.

Devices which may be formed on crystals of the present invention may comprise any suitable device structure, including, but not limited to, devices such as light emitting diodes (LEDs), detectors, filters, transistors, rectification circuitry, light amplifiers, emitters, diodes, solar cells, optically bistable devices, and lasers.

In one embodiment of the invention, the crystals are used in UV LEDs. UV LEDs. UV LEDs are known to improve with increasing material quality. High material quality such as low dislocation density, free from microvoid or nanopoid, is extremely important for many devices currently being developed or commercialized in the GaN field such as lasers, UV LEDs, AlGaN/GaN high electron mobility transistors (HEMTs), etc. These qualities are not only important for existing device structures being developed, but enable other device structures (i.e., high Al % device structures or other highly strained device structures) to be achieved as well.

In another embodiment of the invention, the crystals are used in the manufacture of photo-voltaic detector with excellent reverse leakage current density.

EXAMPLES

In the examples, a SiC disk, approximately 3 mm diameter by 1 mm thick, is cut from the end of a 6H—SiC boule that had been grown by conventional physical vapor transport. One surfaces of the SiC disk is finely polished and the concentration of micropipes is characterized by optical microscopy. A dark field photomicrograph of this sample prior to annealing is shown in FIG. 1. The largest dark spots in FIG. 1 are the result of voids present in the SiC boule that are intersected by the slice used to prepare the wafer. The numerous smaller dark spots in FIG. 1 are micropipes, which normally extend throughout the boule.

The SiC disk is placed inside a die along with NaCl powder and compacted into a pill. The pill is assembled into a cell and placed inside a belt press apparatus. The pill is pressurized to approximately 5.5 GPa and heated to about 1250° C. for about 30 minutes. The cell then is cooled and depressurized and removed from the press. The SiC disk is recovered from the cell by dissolution of the salt in water.

Figure 2:
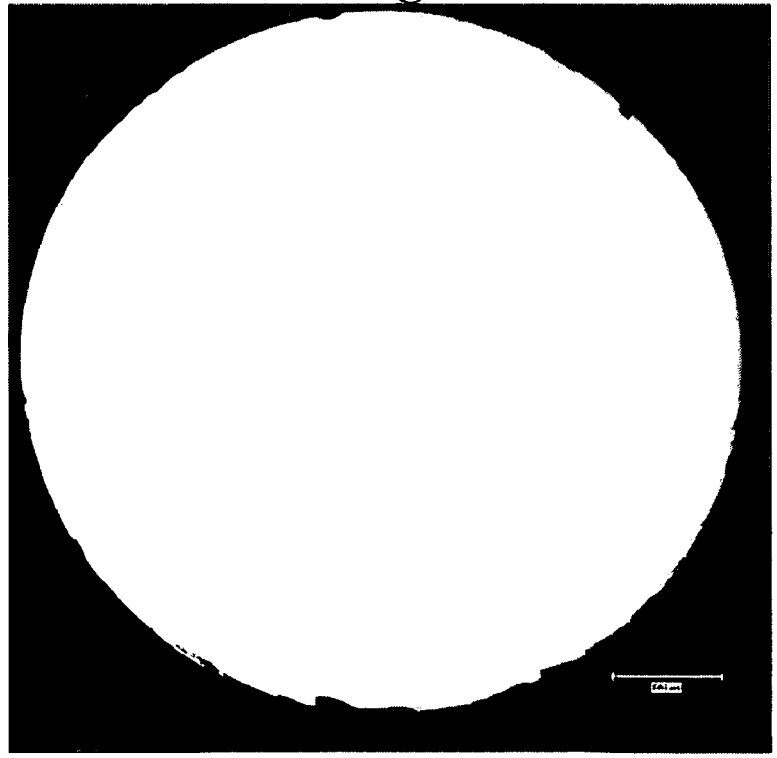
FIG. 2 is an optical micrograph of a highly polished surface of the same 6H—SiC disk after annealing at 1250° C. and 5.5 GPa for 30 minutes.

As the SiC disk shows minor surface damage during the HP/HT processing, so a fresh surface is prepared by re-polishing the disk. A bright-field optical micrograph of the annealed disk is shown in FIG. 2. Only a very few micropipes, evident as dark spots in the image, are visible, indicating that the annealing treatment reduced the concentration of micropipes by approximately two to three orders of magnitude.

While the invention has been described with reference to a preferred embodiment, those skilled in the art will understand that various changes may be made and equivalents may be substituted for elements thereof without departing from the scope of the invention. In addition, many modifications may be made to adapt a particular situation or material to the teachings of the invention without departing from the essential scope thereof.

In this application all units are in the metric system and all amounts and percentages are by weight, unless otherwise expressly indicated. All citations referred herein are expressly incorporated herein by reference.

The invention claimed is:

1. A method for removing one or more defects and/or relieving strain in a non-diamond crystal, the method comprising the steps of:
    placing at least one non-diamond crystal in a sealable vessel or capsule;
    adding a substance to the sealable vessel or capsule that is capable of transforming to a supercritical fluid under pre-determined process conditions;
    sealing the sealable vessel or capsule;
    heating the sealable vessel or capsule to pre-determined process conditions, including a temperature above about 550 degrees Celsius and a pressure between about 0.2 GPa and about 8 GPa, wherein the substance becomes a supercritical fluid at said pre-determined process conditions and surrounds the at least one non-diamond crystal, and maintaining the at least one non-diamond crystal at the pre-determined process conditions for a sufficient amount of time to remove one or more defects and/or relieve strain in the at least one non-diamond crystal; and
    removing at least one improved non-diamond crystal from the sealable vessel or capsule.

2. The method of claim 1 further comprising the step of placing the sealed capsule in a high pressure apparatus, wherein the capsule is formed from a deformable material and is fluid impermeable and chemically inert with respect to the at least one non-diamond crystal and the supercritical fluid under the predetermined process conditions.

3. The method of claim 2 wherein the high pressure apparatus is selected from one of an autoclave, a piston cylinder press, a belt press, a multi-anvil press, a toroidal press, and a zero-stroke high pressure apparatus.

4. The method of claim 1 further comprising the step of embedding the at least one non-diamond crystal in a glass that is molten under the pre-determined process conditions, wherein the glass is chemically inert with respect to the at least one non-diamond crystal and the supercritical fluid under the predetermined process conditions.

5. The method of claim 4, wherein the glass is selected to be one or more of $Li_2O$, $Na_2O$, $K_2O$, MgO, CaO, SrO, BaO, $B_2O_3$, $Al_2O_3$, $Ga_2O_3$, $In_2O_3$, $SiO_2$, $GeO_2$, $SnO_x$, $PbO_x$, a phosphate glass, a fluoride glass, a nitride glass, and compounds or mixtures thereof.

6. The method of claim 1 wherein the substance comprises ammonia.

7. The method of claim 1 wherein the non-diamond crystal crystal is selected from one of a direct bandgap semiconductor material; an indirect bandgap semiconductor material; a wide bandgap semiconductor material; a scintillator material; a nonlinear optical material; a laser material, a relaxor ferroelectric material; and a piezoelectric material.

8. The method of claim 1 wherein the at least one non-diamond crystal is selected from among 6H—SiC, 4H—SiC, 15R—SiC, 3C—SiC, 8H—SiC, 2H—SiC, silicon (Si), germanium (Ge), cubic boron nitride (cBN), gallium antimonide (GaSb), aluminum nitride (AlN), bismuth antimonide ($Bi_xSb_{1-x}$), gallium arsenide (GaAs), gallium phosphide (GaP), gallium indium phosphide (GaInP), aluminum indium phosphide (AlInP), indium aluminum arsenide (InAlAs), aluminum gallium antinomide (AlGaSb), indium aluminum gallium arsenide (InAlGaAs), aluminum indium gallium phosphide (AlInGaP), aluminum gallium arsenide (AlGaAs), indium gallium arsenide phosphide (InGaAsP), gallium selenide (GaSe), indium phosphide (InP), indium selenide (InSe and $InSe_2$), indium antimonide (InSb), cadmium phosphide ($Cd_3P_2$), cadmium indium sulphide ($CdIn_2S_4$), cadmium silicon arsenide ($CdSiAs_2$), cadmium tin phosphide ($CdSnP_2$), zinc oxide (ZnO), zinc selenide (ZnSe), zinc telluride (ZnTe), cadmium sulphide (CdS), cadmium zinc selenide (CdZnSe), beryllium zinc cadmium selenide (BeZnCdSe), zinc cadmium magnesium selenide (ZnCdMgSe), zinc sulphur selenide (ZnSSe), beryllium zinc selenide (BeZnSe), beryllium magnesium zinc selenide (BeMgZnSe), cadmium telluride (CdTe), cadmium zinc telluride ($Cd_xZn_{1-x}Te$), mercury cadmium telluride (HgCdTe), lead sulphide (PbS), lead telluride (PbTe), lead selenide (PbSe), lead tin telluride (PbSnTe), lead germanium telluride (PbGeTe), lead europium telluride (PbEuTe), lead europium selenide (PbEuSe), lead cadmium sulphide (PbCdS), lead europium selenium telluride (PbEuSeTe), lead sulphur selenide (PbSSe), lithium triborate ($LiB_3O_5$ or LBO), yttrium orthovandate ($YVO_4$), potassium titanyl phosphate ($KTiOPO_4$ or KTP), potassium niobate ($KnbO_3$ or KN), cesium lithium borate ($CsLiB_6O_{10}$ or CLBO), $LiCaAlF_6$ (LiCAF), $LiSrAlF_6$ (LiSAF), lead zirconate titanate ($Pb(Zr_x-Ti_{1-x})O_3$ or PZT), lead magnesium niobate ($Pb(Mg_{1/3}Nb_{2/3})O_3$ or PMN), lead zirconate niobate ($Pb(Zr_{1/3}Nb_{2/3})O_3$ or PZN), bismuth silicon oxide (BSO), barium titanate (BTO), lead magnesium niobate titanate ($Pb(Mg_{x/3}Nb_{2x/3}Ti_{1-x})O_3$ or PMNT), lead zirconate niobate titanate ($Pb(Zr_{x/3}Nb_{2x/3}Ti_{1-x})O_3$ or PZNT), strontium hafnate ($SrHfO_3$) and barium hafnate ($BaHfO_3$), rare earth lanthanide-ion laser crystals with matrices of silica, silicates and fluorozirconates, lasers crystals based on matrices of KCl, RbCl, NaCl, CuCl, CsI, $CaF_2$, $ZnF_2$, $MgF_2$, $SrF_2$, $MnF_2$, ZnS, ZnSe, $CaF_2$, $ErF_3$, KI, $RbCaF_3$, $LiNbO_3$, $KMgF_3$, $Ca_2PO_4Cl$, $CaGd_2(SiO_4)_3O$, $LaCl_3$, $LiYF_4$, $LaF_3$, $Y_3Al_5O_{12}$, $LiYF_4$, $LuAlO_3$, $YAlO_3$, $Gd_3Ga_5O_{12}$, $CaF_2$—$ErF_3$, $Er_3Al_5O_{12}$, $Lu_3Al_5O_{12}$, $BaYb_2F_8$, NaF, LIF, sapphire, alexandrite, forsterite, $BaF_2$, $BaY_2F_8$, $BaEr_2F_8$, RbBr, $Li_2GeO_3$, $Y_2O_3$, $Er_2O_3$, $YVO_4$, $GdAlO_3$, $Y_3Sc_2Ga_3O_{12}$, $NaCaErF_6$, $CaWO_4$, or $CaMoO_4$.

9. The method of claim 1 wherein the at least one non-diamond crystal comprises GaN and the substance comprises ammonia.

10. The method of claim 1, wherein the pressure in the pre-determined process conditions is at least 0.5 GPa.

11. The method of claim 1, further comprising forming an epitaxial layer on the improved crystal.

12. The method of claim 1, further comprising incorporating at least a portion of the improved crystal into a semiconductor device.

13. The method of claim 12, wherein the semiconductor device comprises a light emitting diode (LED), a laser diode, a photodetector, a filter, a transistor, a rectifier, a thyristor, a light amplifier, an emitter, a detector, a diode, a switch, a solar cell, or an optically bistable device.

14. A method for removing one or more defects and/or relieving strain in an amorphous material, the method comprising the steps of:
    placing an amorphous material selected from one of glass, plastic, or metal in a sealable vessel or capsule;
    adding a substance to the sealable vessel or capsule that is capable of transforming to a supercritical fluid under pre-determined process conditions;
    sealing the sealable vessel or capsule;
    heating the sealable vessel or capsule to a temperature above about 550 degrees Celsius, wherein the substance becomes a supercritical fluid at a pressure between about 0.2 GPa and about 8 GPa and surrounds the at least one non-diamond crystal, and maintaining the at least one non-diamond crystal at this temperature for a sufficient amount of time to remove one or more defects and/or relieve strain in the amorphous material; and
    removing an improved amorphous or crystalline material from the sealable vessel or capsule.

15. The method of claim 14 further comprising the step of placing the sealed capsule in a high pressure apparatus, wherein the capsule is formed from a deformable material and is fluid impermeable and chemically inert with respect to the amorphous material and the supercritical fluid under the predetermined process conditions.

16. The method of claim 15 wherein the high pressure apparatus is selected from one of an autoclave, a piston cylinder press, a belt press, a multi-anvil press, a toroidal press, and a zero-stroke high pressure apparatus.

17. The method of claim 14 wherein the substance comprises ammonia.

* * * * *